US012644919B2

(12) United States Patent
Pino et al.

(10) Patent No.: US 12,644,919 B2
(45) Date of Patent: Jun. 2, 2026

(54) ADVANCED POWER MOS R$_{DS-ON}$ DRIVEN LIFETIME PREDICTION

(71) Applicants: STMicroelectronics International N.V., Geneva (CH); UNIVERSITA' DI CATANIA, Catania (IT)

(72) Inventors: Carmelo Pino, Catania (IT); Francesco Rundo, Gravina di Catania (IT); Salvatore Coffa, Milan (IT); Concetto Spampinato, Catania (IT)

( * ) Notice: Subject to any disclaimer, the term of this patent is extended or adjusted under 35 U.S.C. 154(b) by 147 days.

(21) Appl. No.: 18/738,789

(22) Filed: Jun. 10, 2024

(65) Prior Publication Data

US 2025/0377399 A1     Dec. 11, 2025

(51) Int. Cl.
*G01R 31/26*     (2020.01)
*H03K 17/687*     (2006.01)

(52) U.S. Cl.
CPC ....... *G01R 31/2621* (2013.01); *H03K 17/687* (2013.01)

(58) Field of Classification Search
CPC ............................ G01R 31/2621; H03K 17/687
USPC ......................................................... 327/389
See application file for complete search history.

(56) References Cited

U.S. PATENT DOCUMENTS 7,330,046 B2     2/2008  Durbaum

2002/0008252 A1*   1/2002  Koike ................... G01R 31/287
                                                      257/E21.525
2013/0024179 A1   1/2013  Mazzaro
2014/0103937 A1*   4/2014  Khan ..................... G01R 31/40
                                                      324/762.08

(Continued)

FOREIGN PATENT DOCUMENTS

CN         107315138 B     7/2021
CN         115495924 A     12/2022

OTHER PUBLICATIONS

Bai, Yun et al., "Identification of MOSFET Working State Based on the Stress Wave and Deep Learning," in IEEE Transactions on Instrumentation and Measurement, vol. 71, pp. 1-9, 2022, Art No. 9003209, doi: 10.1109/TIM.2022.3165276, Apr. 6, 2022.

(Continued)

*Primary Examiner* — William Hernandez
(74) *Attorney, Agent, or Firm* — Slater Matsil, LLP

(57)          ABSTRACT

According to an embodiment, a system is proposed for predicting future drain-to-source resistance values of a power metal-oxide-semiconductor field-effect transistor (MOSFET). The system includes a current sensing circuit configured to extract a drain current of the power MOSFET during a transient or switching phase of the power MOS-FET; a conditioning circuit configured to extract a drain-to-source voltage of the power MOSFET during the transient or switching phase of the power MOSFET; and a machine learning model configured to receive the drain current and the drain-to-source voltage of the power MOSFET as inputs, and determine future drain-to-source resistance values of the power MOSFET using the machine learning model based on the extracted drain current and the drain-to-source voltage of the power MOSFET, wherein a fault condition of the power MOSFET is signaled in response to the predicted future drain-to-source resistance values exceeding a threshold.

20 Claims, 3 Drawing Sheets

(56) References Cited

U.S. PATENT DOCUMENTS

| | | | |
|---|---|---|---|
| 2021/0048478 A1* | 2/2021 | Danesh | G01R 31/3275 |
| 2022/0108401 A1 | 4/2022 | Walia | |
| 2023/0104896 A1* | 4/2023 | Pattipati | G01R 31/3277 |
| | | | 706/21 |
| 2023/0110695 A1* | 4/2023 | Krishnamoorthy | G01R 31/64 |
| | | | 324/762.01 |

OTHER PUBLICATIONS

Remadna, Ikram et al., "Rul estimation enhancement using hybrid deep learning methods," International Journal of Prognostics and Health Management, vol. 12 No. 1 (2021), 19 pages.
Witczak, Marcin et al., "Remaining Useful Life Prediction of MOSFETs via the Takagi-Sugeno Framework," Energies 14, No. 8: 2135, published Apr. 11, 2021, 23 pages.

* cited by examiner

100

300

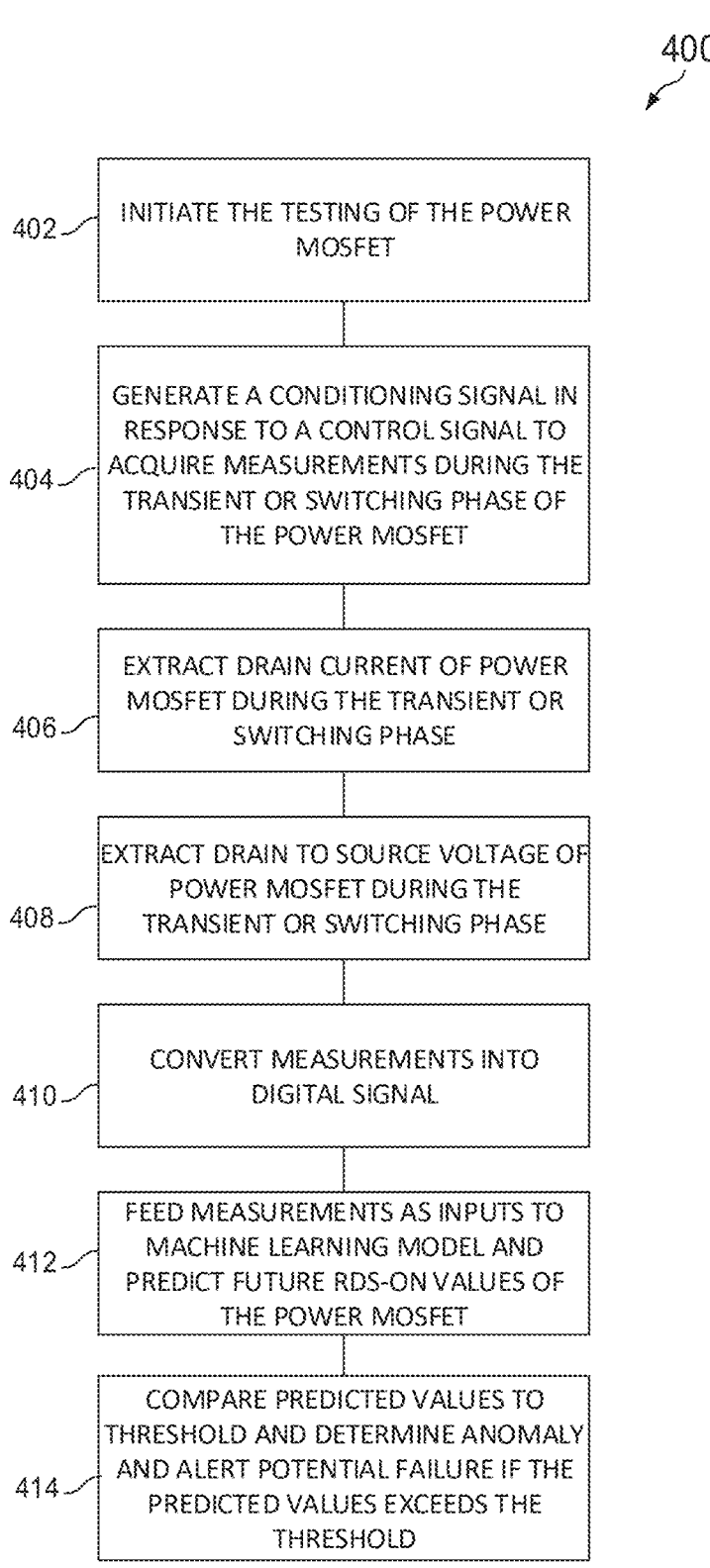

400

402 — INITIATE THE TESTING OF THE POWER MOSFET

404 — GENERATE A CONDITIONING SIGNAL IN RESPONSE TO A CONTROL SIGNAL TO ACQUIRE MEASUREMENTS DURING THE TRANSIENT OR SWITCHING PHASE OF THE POWER MOSFET

406 — EXTRACT DRAIN CURRENT OF POWER MOSFET DURING THE TRANSIENT OR SWITCHING PHASE

408 — EXTRACT DRAIN TO SOURCE VOLTAGE OF POWER MOSFET DURING THE TRANSIENT OR SWITCHING PHASE

410 — CONVERT MEASUREMENTS INTO DIGITAL SIGNAL

412 — FEED MEASUREMENTS AS INPUTS TO MACHINE LEARNING MODEL AND PREDICT FUTURE RDS-ON VALUES OF THE POWER MOSFET

414 — COMPARE PREDICTED VALUES TO THRESHOLD AND DETERMINE ANOMALY AND ALERT POTENTIAL FAILURE IF THE PREDICTED VALUES EXCEEDS THE THRESHOLD

FIG. 4

ADVANCED POWER MOS $R_{DS-ON}$ DRIVEN LIFETIME PREDICTION

TECHNICAL FIELD

The present disclosure generally relates to electronic devices and, in particular embodiments, to an advanced power metal-oxide-semiconductor field-effect transistor (MOSFET) $R_{DS-ON}$ driven lifetime prediction.

BACKGROUND

Generally, estimating the longevity of components in power electronics poses a significant challenge that extends across various domains of relevance. The ability to accurately predict the remaining useful life of such components is particularly crucial. It confers the benefit of enacting preventive measures that can preclude the adverse effects of device failure upon reaching the culmination of its operational lifespan.

SUMMARY

Technical advantages are generally achieved by embodiments of this disclosure, which describe an advanced power metal-oxide-semiconductor field-effect transistor (MOSFET) $R_{DS-ON}$ driven lifetime prediction.

A first aspect relates to a system to predict future drain-to-source resistance values of a power metal-oxide-semiconductor field-effect transistor (MOSFET). The system includes a current sensing circuit configured to extract a drain current of the power MOSFET during a transient or switching phase of the power MOSFET; a conditioning circuit configured to extract a drain-to-source voltage of the power MOSFET during the transient or switching phase of the power MOSFET; and a machine learning model configured to receive the drain current and the drain-to-source voltage of the power MOSFET as inputs, and determine future drain-to-source resistance values of the power MOSFET using the machine learning model based on the extracted drain current and the drain-to-source voltage of the power MOSFET, wherein a fault condition of the power MOSFET is signaled in response to the predicted future drain-to-source resistance values exceeding a threshold.

A second aspect relates to a method to predict future drain-to-source resistance values of a power metal-oxide-semiconductor field-effect transistor (MOSFET). The method includes extracting a drain current and a drain-to-source voltage of the power MOSFET during a transient or switching phase of the power MOSFET; providing the drain current and the drain-to-source voltage of the power MOSFET as inputs to a machine learning model; determining future drain-to-source resistance values of the power MOSFET using the machine learning model based on the extracted drain current and the drain-to-source voltage of the power MOSFET; and signaling a fault condition of the power MOSFET in response to the predicted future drain-to-source resistance values exceeding a threshold.

A third aspect relates to a vehicle, comprising a conditioning signal sub-system configured to predict future drain-to-source resistance values of a power metal-oxide-semiconductor field-effect transistor (MOSFET), the conditioning signal sub-system comprising a current sensing circuit configured to extract a drain current of the power MOSFET during a transient or switching phase of the power MOSFET, a conditioning circuit configured to extract a drain-to-source voltage of the power MOSFET during the transient or switching phase of the power MOSFET; and an electronic control unit (ECU) comprising a machine learning model, the ECU configured to: determine future drain-to-source resistance values of the power MOSFET using the machine learning model based on the extracted drain current and the drain-to-source voltage of the power MOSFET, and signal a fault condition of the power MOSFET in response to the predicted future drain-to-source resistance values exceeding a threshold.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings, in which:

FIG. 4 is a flow chart of an embodiment method.

DETAILED DESCRIPTION OF ILLUSTRATIVE EMBODIMENTS

Figure 1:
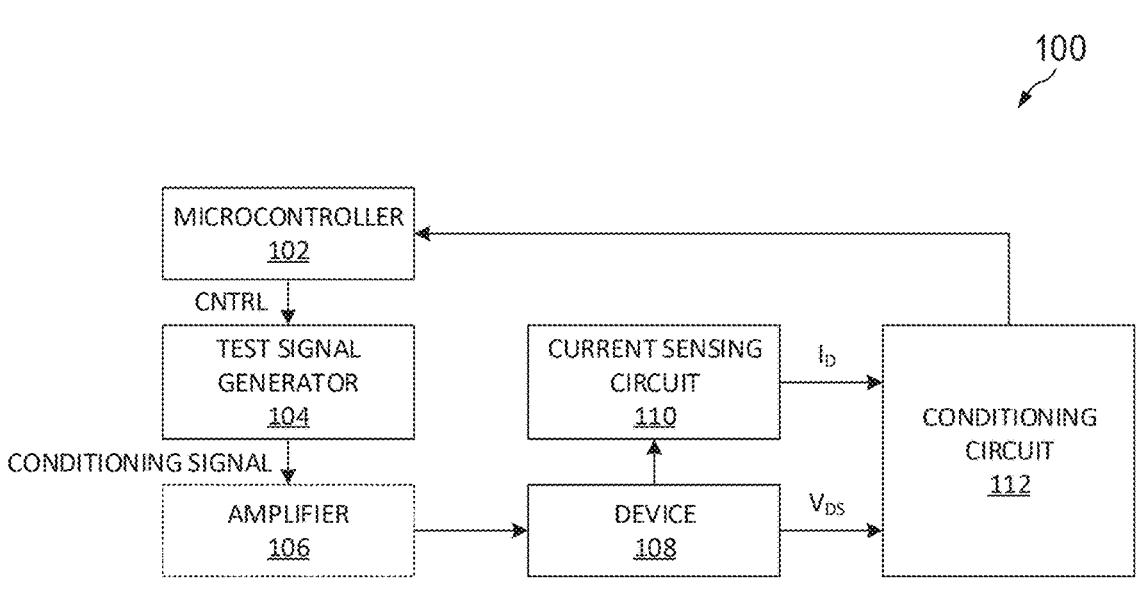
FIG. 1 is a block diagram of an embodiment system to assess the health of a device.

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise. Various embodiments are illustrated in the accompanying drawing figures, where identical components and elements are identified by the same reference number, and repetitive descriptions are omitted for brevity.

Variations or modifications described in one of the embodiments may also apply to others. Further, various changes, substitutions, and alterations can be made herein without departing from the spirit and scope of this disclosure as defined by the appended claims.

The drain-to-source resistance ($R_{DS}$) in the context of transistor operation, particularly in field-effect transistors (FETs) such as Metal-Oxide-Semiconductor FETs (MOSFETs), characterizes the impedance between the drain and source terminals of the transistor when current flows through the channel formed by a voltage applied at the gate terminal.

The magnitude of the drain-to-source resistance ($R_{DS}$) directly impacts electronic circuits' efficiency and power consumption by influencing the amount of voltage drop and power dissipation across the transistor when it is conducting. A low drain-to-source resistance ($R_{DS}$) is desirable because it allows for higher current flow at a given voltage, leading to better transistor performance with lower losses. The value of the drain-to-source resistance ($R_{DS}$) is influenced by factors including the transistor's geometry, the materials used, and the operational mode of the device.

Generally, monitoring a transistor's $R_{DS-ON}$ curve throughout its operational period can be used as a marker to determine the end of its life in power electronics. Under normal operating conditions, the $R_{DS-ON}$ curve remains within a specific range. Deviations from this range, where the curve surpasses an established threshold, can signal the onset of potential malfunctions. Recognizing these changes is advantageous for understanding when a component cannot perform optimally.

Conventional approaches to detect a change in the $R_{DS\text{-}ON}$ curve typically exhibit limitations, such as diminished predictive capabilities inherent in the proposed techniques. These methods lack the flexibility to adjust to varying types of devices, making them less versatile across diverse applications. Further, these solutions have no mechanisms to counteract noise or adversarial interferences, leaving them vulnerable to inaccurate performance under less-than-ideal operational conditions.

In embodiments, a machine learning model and system are proposed to evaluate the health of power devices by continuously monitoring the component's $R_{DS\text{-}ON}$ curve. Utilizing the data obtained from this monitoring process, the model retrieves interim status updates on the condition of the power devices by detecting minimal drift in the drain-to-source resistance ($R_{DS}$). This information is used to determine the dynamics of the drift and predict the remaining useful life of the power device, forming a part of the health assessment process.

In embodiments, a proposed solution utilizes a machine learning model to assess variations in the $R_{DS\text{-}ON}$ value. The machine learning model is trained using a dataset that encompasses the lifespan cycles of numerous power metal-oxide-semiconductor field-effect transistors (MOSFETs). The predictive model operates on, for example, artificial intelligence techniques, incorporating regularization of the Jacobian of the gradient as a strategy to mitigate the impact of input noise during the sampling and measuring process.

Aspects of this disclosure propose a predictive model that can predict $R_{DS\text{-}ON}$ values at future intervals, for example, at 10, 15, and 20 cycles ahead. The results demonstrate high predictive accuracy, particularly in forecasting $R_{DS\text{-}ON}$ values at least 20 samples before reaching a critical point. The solution enhances the ability to plan preventive maintenance strategies well in advance, as interventions can be scheduled when predictions indicate that the $R_{DS\text{-}ON}$ value is nearing or has crossed the threshold deemed acceptable for safe operation.

FIG. 1 illustrates a block diagram of an embodiment system 100 to assess the health of a device 108. System 100 includes a microcontroller unit 102, a test signal generator circuit 104, an optional amplifier 106, the device 108, a current sensing circuit 110, and a conditioning circuit 112, which may (or may not be arranged as shown). System 100 may include additional components that are not shown, such as volatile or non-volatile memory, to store instructions or data. Although a single device 108 is shown in system 100, additional devices can be included in system 100, and the microcontroller unit 102 can be used to monitor these additional device's health similarly to the monitoring of device 108.

The microcontroller unit 102 can be integrated into an application such as an electronic control unit (ECU) found, for example, within a vehicle. The device 108 can be a power device such as a power MOSFET. It can be integrated into a subsystem of the vehicle. For example, device 108 can be a power MOSFET of a traction inverter system of an electric car.

The current sensing circuit 110 is configured to extract the drain current ($I_D$) of device 108 using, for example, a sense resistor. The drain current ($I_D$) of device 108 is provided to the conditioning circuit 112, which is additionally configured to receive the drain-to-source voltage (VDS) of device 108.

The microcontroller unit 102 signals to the test signal generator circuit 104 to generate a conditioning signal directed at device 108. The conditioning signal facilitates the acquisition of the drain-to-source voltage ($V_{DS}$) and the drain current ($I_D$) measurements during the transient or switching phase of the device 108. This is because the data collected while device 108 is in a steady, saturated state does not provide information that can be used to predict future $R_{DS\text{-}ON}$ device characteristics. In contrast, relevant and predictive data regarding the device's performance can be obtained by capturing the values during switching.

In embodiments, the amplifier 106 is configured to receive, amplify, and transmit the amplified conditioning signal to the device 108.

Due to the high-speed switching within device 108, the amplified conditioning signal effectively slows down the switching rate, thereby permitting accurate sampling of the drain-to-source voltage ($V_{DS}$) and the drain current ($I_D$) during the switching phase of device 108.

The extracted drain-to-source voltage ($V_{DS}$) and the drain current ($I_D$) values are analog signals to conditioning circuit 112, which is configured to sample and amplify the drain-to-source voltage ($V_{DS}$) and the drain current ($I_D$) values in analog form. The analog signals are fed to an analog-to-digital converter (ADC) to be converted into digital values. A trained machine learning model implemented in the microcontroller unit 102 receives the digital samples and provides a predictive future value for $R_{DS\text{-}ON}$ of device 108 by continuously monitoring the component's $R_{DS\text{-}ON}$ curve generated by the output of the model.

In embodiments, the conditioning circuit 112 includes an analog-to-digital converter (ADC) embedded within. In embodiments, the microcontroller unit 102 includes an integrated ADC. In some embodiments, an ADC is coupled between the device 108 and the microcontroller unit 102. Regardless of the arrangement, the ADC is configured to convert the analog values extracted from the device 108 to a digital signal. In embodiments, the ADC is a 12-bit ADC.

The microcontroller unit 102 is configured to provide the digital signal from device 108 during its transient or switching phase as input to a machine-learning model. In embodiments, the machine learning model is implemented in the microcontroller unit 102's firmware or hosted in a different processor.

The machine learning model is configured to receive the digital signal as an input and predict the $R_{DS\text{-}ON}$ values for the device 108 at future intervals, for example, at 10, 15, and 20 cycles ahead.

The microcontroller unit 102 is configured to receive the predicted $R_{DS\text{-}ON}$ values for device 108 from the machine learning model and determine whether they exceed a threshold value. In response to any predicted values exceeding the threshold values, the microcontroller unit 102 is configured to generate a signal indicating a possible anomaly with device 108. For example, the vehicle's ECU can receive the signal and flag a check engine light, alerting the driver to bring the vehicle in for service.

Figure 2:
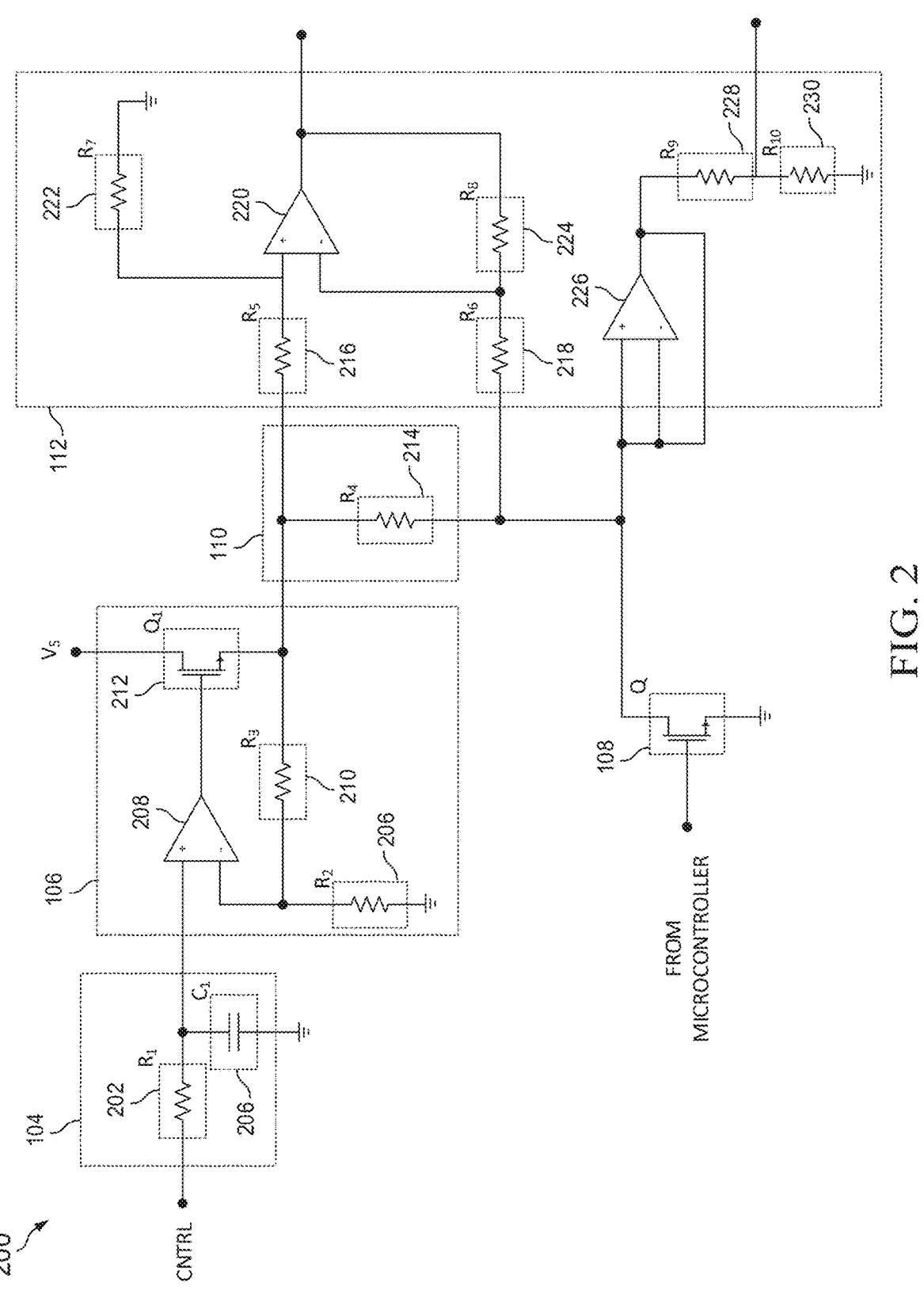
FIG. 2 is a schematic of a conditioning signal sub-system, which may be implemented in the system of FIG. 1.

FIG. 2 illustrates a schematic of a conditioning signal sub-system 200, which may be implemented in system 100. Conditioning signal sub-system 200 includes the test signal generator circuit 104, the optional amplifier 106, the device 108, the current sensing circuit 110, and the conditioning circuit 112, which may (or may not) be arranged as shown. Conditioning signal sub-system 200 may include additional components not shown, such as volatile or non-volatile memory, to store instructions or data. Although a single device 108 is shown, additional devices can be included and monitored.

Test signal generator circuit 104 includes a series resistor ($R_1$) 202 coupled to a shunt capacitor ($C_1$) 204, which may (or may not) be arranged as shown. Test signal generator circuit 104 may include additional components that are not shown. In embodiments, the resistance value of the series resistor ($R_1$) 202 is approximately 24 k Ω (±10%). In embodiments, the capacitive value of the shunt capacitor ($C_1$) 204 is approximately 10 μF (±10%).

The series resistor ($R_1$) 202 and the shunt capacitor ($C_1$) 204 form a basic RC circuit that generates an output voltage that varies over time—a ramp. When a control signal is introduced to the series resistor ($R_1$) 202 from the microcontroller unit 102, the subsequent behavior of the output voltage is largely defined by this input.

Upon application of the control signal to the series resistor ($R_1$) 202, the shunt capacitor ($C_1$) 204 begins to charge or discharge, resulting in a change in voltage at the junction between the series resistor ($R_1$) 202 and the shunt capacitor ($C_1$) 204. This junction voltage is known as the conditioning signal and changes in a fashion that can be controlled—typically either linearly or exponentially—based on the properties of the RC circuit.

The conditioning signal facilitates the capture of accurate readings of drain-to-source voltage ($V_{DS}$) and the drain current ($I_D$) during the transient phase of the operation of device 108. The transitional periods are particularly revealing as they offer performance data that steady-state measurements fail to capture. This phase allows the conditioning signal sub-system 200 to determine the device's condition under actual switching conditions, unlike constant operation conditions, which may not accurately represent real-world stresses on the device 108.

Consider the resistance between the drain and source while the device is active ($R_{DS-ON}$). Accurate prediction of $R_{DS-ON}$ over time and under varying loads is advantageous for determining power semiconductor devices' operational efficiency and dissipation, such as device 108. Accordingly, the test signal generator circuit 104 provides a conditioning signal to the optional amplifier 106 that allows for better predictive modeling of device 108 by evaluating its characteristics during switching—thereby obtaining valuable insights into future performance and reliability that steady-state measurement simply cannot provide.

The optional amplifier 106 includes a second resistor ($R_2$) 206, an operational amplifier (op-amp) 208, a third resistor ($R_3$) 210, and an n-channel transistor ($Q_1$) 212, which may (or may not) be arranged as shown. Amplifier 106 may include additional components not shown. In embodiments, amplifier 106 is configured to amplify and shape the conditioning signal from the test signal generator circuit 104 for better monitoring and predictive analysis of the device 108 being tested. In embodiments, the resistance value of the second resistor ($R_2$) 206 is approximately 20 kΩ (±10%). In embodiments, the resistance value of the third resistor ($R_3$) 210 is approximately 200 kΩ (±10%).

The amplifier 106 is designed around the op-amp 208, which serves as the core amplifying element. The non-inverting input of the op-amp 208 is fed the conditioning signal from the test signal generator circuit 104. The inverting input of op-amp 208 is connected to the second resistor ($R_2$) 206 and the third resistor ($R_3$) 210.

The second resistor ($R_2$) 206 establishes a feedback path where the second resistor ($R_2$) 206 is tied to the ground at its other end. The feedback loop through the second resistor ($R_2$) 206 sets the gain of the amplifier 106 and aids in stabilizing its operation.

On the output side, op-amp 208 drives the control terminal of the n-channel transistor ($Q_1$) 212. This coupling translates the amplified signal into a form that can modulate the operation of the n-channel transistor ($Q_1$) 212. The drain terminal of the n-channel transistor ($Q_1$) 212 is coupled to a voltage supply (Vs), essentially positioning it as an electronically controlled switch or active load within the circuit, and its source terminal connects back to the other end of the third resistor ($R_3$) 210.

The third resistor ($R_3$) 210, arranged between the source terminal of the n-channel transistor ($Q_1$) 212 and the inverting input of the op-amp 208, functions within a feedback network that collaborates with the second resistor ($R_2$) 206 to set the gain and response time of the amplifier 106. Additionally, this configuration allows for proportional control of the n-channel transistor ($Q_1$) 212 based on the conditioning signal, enabling the amplifier 106 to handle variations in current flow through the n-channel transistor ($Q_1$) 212 with a level of precision that is conducive to accurately capturing dynamic electrical characteristics (i.e., the drain-to-source voltage ($V_{DS}$) and the drain current ($I_D$)).

In embodiments, the current sensing circuit 110 includes a fourth resistor ($R_4$) 214 coupled to the source terminal of the n-channel transistor ($Q_1$) 212 and the drain terminal of the device 108. Current sensing circuit 110 is configured to sense the drain current ($I_D$) of device 108. The fourth resistor ($R_4$) 214 is coupled in series with the drain terminal of device 108 to function as a current-sensing resistor. Since the voltage drop across the fourth resistor ($R_4$) 214 is directly proportional to the current flowing through it (as described by Ohm's law, V=IR), by selecting an appropriately valued resistor and measuring the voltage drop across it, one can infer the drain current ($I_D$) of device 108. Using this current-measuring strategy allows for continuous real-time monitoring of the drain current ($I_D$) of device 108. In embodiments, the resistance value of the fourth resistor ($R_4$) 214 is approximately 20 mΩ (±10%). Since the fourth resistor ($R_4$) 214 is chosen to have a very low resistance value to minimize power loss, the voltage drop across it will be small for low to moderate currents. Therefore, an amplifier is used to scale this voltage up to a measurable level.

The conditioning circuit 112 includes a second op-amp 220 and a third op-amp 226.

The second op-amp 220 is arranged in a differential amplifier configuration. It is configured to sense and amplify the voltage drop across the fourth resistor ($R_4$) 214 (i.e., sense resistor) to monitor the drain current ($I_D$) of device 108.

The fourth resistor ($R_4$) 214 has its first terminal coupled to the non-inverting input of the second op-amp 220 through a fifth resistor ($R_5$) 216. The non-inverting input of the second op-amp 220 is also coupled to the reference ground through a seventh resistor ($R_7$) 222. This arrangement creates a voltage divider between the fifth resistor ($R_5$) 216 and the seventh resistor ($R_7$) 222, which sets the voltage reference level for the non-inverting input of the second op-amp 220.

The second terminal of the fourth resistor ($R_4$) 214 is coupled to the inverting input of the second op-amp 220 by a sixth resistor ($R_6$) 218. The inverting input is also coupled to the output of the second op-amp 220 through an eight resistor ($R_8$) 224. The sixth resistor ($R_6$) 218 and the eighth resistor ($R_8$) 224 create a feedback loop to determine the gain of the second op-amp 220.

The second op-amp 220 is configured to measure the current (i.e., the drain current ($I_D$) of device 108) flowing through the fourth resistor ($R_4$) 214 by measuring the voltage drop across it. The current can be deduced based on Ohm's Law (I=V/R), where 'I' is the current, 'V' is the voltage drop, and 'R' is the resistance of the sense resistor.

The second op-amp 220 amplifies the difference in voltage between its non-inverting and inverting inputs. The voltage at the non-inverting input is fixed by the voltage divider formed by the fifth resistor ($R_5$) 216 and the seventh resistor ($R_7$) 222. In contrast, the voltage at the inverting input will vary with the current through the sense resistor (and hence the voltage drop across it). By setting appropriate values for the sixth resistor ($R_6$) 218 and the eighth resistor ($R_8$) 224, the gain of the second op-amp 220 can be controlled such that even a small voltage across the sense resistor translates into a significantly higher output voltage that can be easily measured or processed further.

The third op-amp 226 is arranged in a voltage follower or buffer amplifier configuration to measure the drain-to-source voltage ($V_{DS}$) of device 108. Specifically, the inverting input of the third op-amp 226 is directly coupled to its non-inverting input, which is coupled to the output of the third op-amp 226. In this configuration, the third op-amp 226 maintains the same voltage at its inverting and non-inverting inputs due to its high gain. Since the inputs are directly connected, the output voltage will closely follow the input voltage applied to the non-inverting input. Therefore, any voltage applied to the non-inverting input will be effectively "buffered" to the output without any amplification or attenuation (the gain is unity, which means the output voltage equals the input voltage).

The voltage follower is beneficial because it provides a high input impedance and a low output impedance. This characteristic means the circuit can offer a signal interface without loading down the signal source while providing enough current to drive subsequent stages of a circuit or load.

The output of the third op-amp 226 is coupled to the ninth resistor ($R_9$) 228, coupled to the tenth resistor ($R_{10}$) 230. The second terminal of the tenth resistor ($R_{10}$) 230 is coupled to the reference ground. The shared terminal of the ninth resistor ($R_9$) 228 and the tenth resistor ($R_{10}$) 230 is provided to the ADC as a second analog signal. In embodiments, the resistance value of the ninth resistor ($R_9$) 228 is approximately 30 kΩ (±10%). In embodiments, the resistance value of the tenth resistor ($R_{10}$) 230 is approximately 10 kΩ (±10%).

Subsequently, the ninth resistor ($R_9$) 228 and the tenth resistor ($R_{10}$) 230 constitute a voltage divider that effectively scales down the output voltage from the third op-amp 226 based on the resistance values chosen for these two resistors. The voltage available at the junction (the shared terminal) between ninth resistor ($R_9$) 228 and the tenth resistor ($R_{10}$) 230 is proportionate to their values, according to the voltage divider formula.

Accordingly, the voltage available at the junction (the shared terminal) between ninth resistor ($R_9$) 228 and the tenth resistor ($R_{10}$) 230 provides an analog representation of the drain-to-source voltage ($V_{DS}$) of device 108.

It is important to note that in control circuits, connecting an op-amp output directly to the drain might be part of a larger feedback network to regulate V_DS according to some reference voltage applied at an op-amp input, rather than directly measuring V_DS as a standalone voltage. The exact function will depend on how both inputs of the op-amp are configured and what feedback elements are included in the circuit.

In embodiments, the gate terminal of the device 108 is coupled to the microcontroller unit 102 to synchronize the operation of the device 108 with the sampling disclosed herein.

Figure 3:
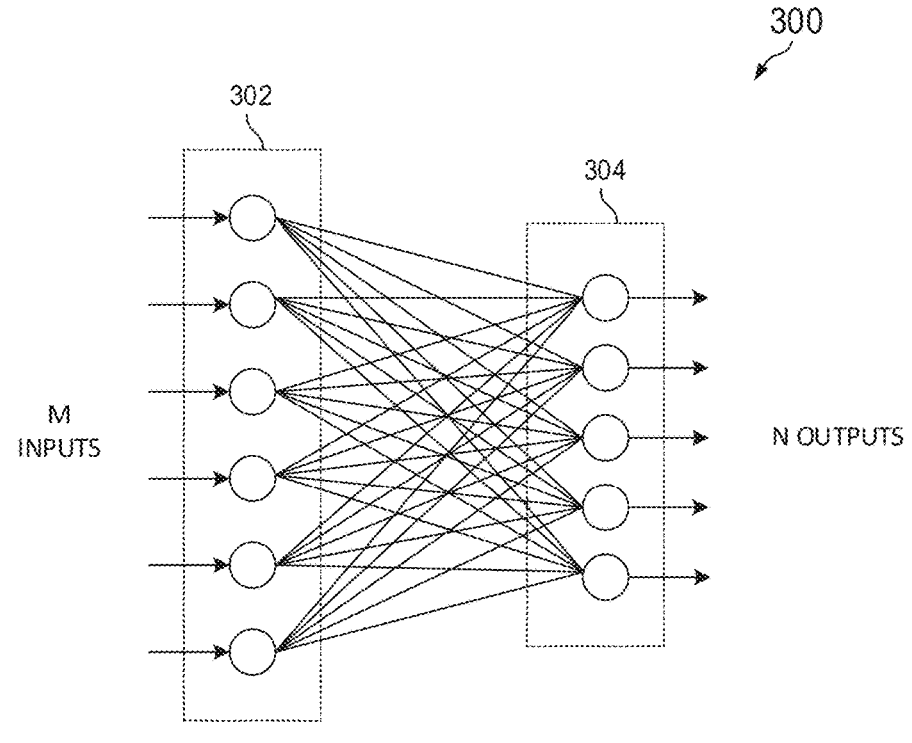
FIG. 3 is a block diagram of a machine learning model, which may be implemented in the firmware of the microcontroller unit of the system of FIG. 1.

FIG. 3 illustrates a block diagram of a machine learning model 300, which may be implemented in the firmware of the microcontroller unit 102 of system 100. Machine learning model 300 includes an input layer 302 and an output layer 304, which may (or may not) be arranged as shown. Machine learning model 300 may include additional layers (e.g., hidden layers) between the input layer 302 and the output layer 304. However, only an input and output layer are shown in FIG. 3 for simplicity of discussion.

In many applications, such as automotive-type microcontroller units, the accessible memory is limited. As such, large and complex neural networks are generally excluded and can be challenging to deploy within these applications. Advantageously, machine learning model 300 is optimized to use minimal memory resources to accurately predict a drift in the $R_{DS-ON}$ values of the device 108.

In embodiments, M samples of drain-to-source voltage ($V_{DS}$) and the drain current ($I_D$) values are collected and fed to the input layer 302 as input data to train the machine learning model 300, where M is an integer greater than one. In embodiments, M equals 20.

In embodiments, the machine learning model 300 is a fully connected neural network with S hidden layers, where S is an integer greater than one. In embodiments, S equals 50. The hidden layers allow the machine learning model 300 to capture and model complex relationships in the data by facilitating the computational equivalent of multiple levels of abstraction. Each hidden layer consists of neurons or nodes fully connected to the preceding input layer 302 (which takes samples as input data) and the subsequent layer 304 in the sequence.

In embodiments, the training process for the machine learning model 300 involves iteratively adjusting its weights and biases across K epochs, where K is an integer greater than one. In embodiments, K equals 200. An epoch in machine learning signifies a full pass through the entire training dataset. Hence, over these K number of epochs, the machine learning model 300 is exposed multiple times to the entire dataset, ensuring sufficient opportunity for learning and error correction.

In embodiments, Mean Squared Error (MSE) is employed as the loss metric to evaluate the model's performance, aiming to minimize the discrepancies between predicted and actual values during training. MSE measures the average squared difference between the estimated values produced by the machine learning model 300 and the actual values in the training data. By squaring each error and then averaging these squares, MSE indicates the performance of the machine learning model 300—the lower the MSE, the better the predictions.

In embodiments, a learning rate (LR) of T is set to guide the optimization process, executed using the Levenberg-Marquardt algorithm as the optimizer, where T is a positive value less than 1. In embodiments, T equals 0.0001. The learning rate represents a conservative approach to updating weights—small steps are taken in updating weights with each iteration, thereby avoiding drastic changes that may lead to overshooting minima in the loss landscape.

The Levenberg-Marquardt algorithm is an iterative method that blends the concepts of gradient descent and the Gauss-Newton method. In embodiments, the Levenberg-Marquardt algorithm is hosted in the microcontroller unit 102.

Calculating the gradient of the loss function with respect to the parameters is a part of this optimization process. To compute the gradient using the full Jacobian matrix, the loss function is first defined, which typically measures the difference between the predicted outputs of the model and the actual target values from the training data.

In this context, the Jacobian is a matrix consisting of first-order partial derivatives of the loss function with respect to each of the model's parameters. Each element of the Jacobian ($J(x)$) represents the partial derivative of the $i^{th}$ output with respect to the $j^{th}$ parameter. When dealing with vector-valued functions, as in machine learning, computing the full Jacobian involves calculating these partial derivatives for every combination of outputs and parameters, as illustrated in the equation:

$$J(x) = \begin{bmatrix} \dfrac{\partial v_1(x)}{\partial x_1} & \dfrac{\partial v_1(x)}{\partial x_2} & \cdots & \dfrac{\partial v_1(x)}{\partial x_n} \\ \dfrac{\partial v_2(x)}{\partial x_1} & \dfrac{\partial v_2(x)}{\partial x_2} & \cdots & \dfrac{\partial v_2(x)}{\partial x_n} \\ \vdots & \vdots & \ddots & \vdots \\ \dfrac{\partial v_N(x)}{\partial x_1} & \dfrac{\partial v_N(x)}{\partial x_2} & \cdots & \dfrac{\partial v_N(x)}{\partial x_n} \end{bmatrix}$$

Once the Jacobian is computed, the gradient of the loss function is determined by multiplying the transposed Jacobian with the vector of residuals (the differences between predicted and actual outputs). This product gives the gradient vector that points toward the steepest increase in the loss function. In the Levenberg-Marquardt algorithm, this gradient is used along with additional terms that scale its components to improve convergence, striking a balance between the speed of gradient descent and the stability of Gauss-Newton steps.

The Levenberg-Marquardt algorithm adjusts model parameters iteratively. Each iteration uses the gradient information and considers the curvature of the loss function by incorporating terms from the Hessian matrix, which is approximated using the outer product of the Jacobian with itself. By combining this information with a damping factor that adjusts each step's magnitude, the algorithm seeks to find a parameter set that effectively minimizes the loss function.

The Hessian matrix contains second-order partial derivatives of the loss function with respect to the model parameters. This matrix captures not just how the loss changes but also how the rate of change itself changes, giving a sense of curvature in the loss surface. With the Hessian, one can perform second-order optimization methods like Newton's method, which converge faster than gradient descent under certain conditions due to considering this curvature.

However, calculating the true Hessian matrix can be computationally expensive and, in some cases, intractable for large machine learning models. Accordingly, embodiments of this disclosure use the Jacobian matrix to approximate aspects of second-order behavior without the need to compute a full Hessian. For example, the outer product of the Jacobian matrix is used with itself (also known as the Gauss-Newton approximation) to approximate the Hessian. This approach simplifies calculations while retaining essential information on the curvature experienced by the model parameters in high-dimensional space.

This approximation works well in the Levenberg-Marquardt algorithm because the algorithm assumes that errors are locally quadratic around the minimum. Thus, by using the outer product of the Jacobian with respect to residuals, an approximation to the Hessian can be made that provides a good balance between computational efficiency and algorithmic performance.

Accordingly, while the Jacobian provides first-order gradient information that guides the direction of parameter adjustment, it can also be used indirectly to approximate second-order information essential for understanding and leveraging the curvature of the loss function surface, thus improving optimization when computing the full Hessian is impractical.

Further, Jacobian regularization is employed to mitigate the impact of noise encountered while measuring drain-to-source voltage ($V_{DS}$) and drain current ($I_D$) values during the operation of the device 108. Generally, oscillations arise from high-frequency components present in the noise. Such frequencies can introduce significant fluctuations in the loss during model training, which, if unmitigated, could detrimentally affect inference and the broader utility of the machine learning model 300.

In embodiments, during the training phase of the machine learning model 300, an artificial penalty term is added to the loss function, including a scaling factor (lambda) multiplied by half the summation of the squared Jacobian elements divided by beta. This regularization term stabilizes the loss function and helps negate the effects of noise-induced oscillations. By incorporating Jacobian regularization, these fluctuations can be counteracted, ensuring that the loss remains within a specific range when faced with noisy input.

Consequently, when noise is present in current and voltage readings during inference, the pre-trained loss function is already apt to compensate, reducing oscillations and improving system performance.

FIG. 4 illustrates a flow chart of an embodiment method 400. In embodiments, method 400 predicts the $R_{DS\text{-}ON}$ values for a power MOSFET using a trained machine learning model to determine fault conditions in the future and alert the user of impending failure. It is noted that all steps outlined in the flow chart of the method are not necessarily required and can be optional. Further, changes to the arrangement of the steps, removal of one or more steps and path connections, and addition of steps and path connections are similarly contemplated.

At step 402, a control signal is generated by, for example, a microcontroller to initiate the testing of the power MOSFET. In embodiments, the microcontroller unit is integrated into an application such as an electronic control unit (ECU) found, for example, within a vehicle. In embodiments, the power MOSFET is integrated into a vehicle subsystem. For example, the power MOSFET can be a power MOSFET of a traction inverter system of an electric car.

At step 404, in response to the control signal being generated, a conditioning signal is directed at device 108 to facilitate the acquisition of the drain-to-source voltage ($V_{DS}$) and the drain current ($I_D$) measurements during the transient or switching phase of the power MOSFET. In embodiments, the conditioning signal is amplified using an amplifier.

At step 406, the drain current ($I_D$) of the power MOSFET device is extracted using, for example, a sense resistor during the transient or switching phase of the power MOSFET. In embodiments, the drain current ($I_D$) or a representative of the current is amplified using, for example, an operational amplifier.

At step 408, the drain-to-source voltage ($V_{DS}$) of the power MOSFET device is extracted during the transient or switching phase of the power MOSFET. In embodiments, the drain-to-source voltage ($V_{DS}$) or a representative of the voltage is amplified using, for example, an operational amplifier.

At step 410, the extracted drain current ($I_D$) and drain-to-source voltage ($V_{DS}$) of the power MOSFET device during the transient or switching phase of the power MOSFET is converted into a digital signal. In embodiments, the analog signals are fed to an analog-to-digital converter (ADC) to be converted into digital values.

At step 412, a trained machine learning model implemented in, for example, the microcontroller receives the digital samples and provides a predictive future value for $R_{DS-ON}$ of the power MOSFET by continuously monitoring the component's $R_{DS-ON}$ curve generated by the output of the model. The machine learning model is configured to receive the digital signal as an input and predict the $R_{DS-ON}$ values for the device 108 at future intervals, for example, at 10, 15, and 20 cycles ahead.

At step 414, the predicted $R_{DS-ON}$ values for the power MOSFET are compared to a threshold value. In response to any predicted values exceeding the threshold values, the microcontroller unit is configured to generate a signal indicating a possible anomaly with power MOSFET. For example, the vehicle's ECU can receive the signal and flag a check engine light, alerting the driver to bring the vehicle in for service.

A first aspect relates to a system to predict future drain-to-source resistance values of a power metal-oxide-semiconductor field-effect transistor (MOSFET). The system includes a current sensing circuit configured to extract a drain current of the power MOSFET during a transient or switching phase of the power MOSFET; a conditioning circuit configured to extract a drain-to-source voltage of the power MOSFET during the transient or switching phase of the power MOSFET; and a machine learning model configured to receive the drain current and the drain-to-source voltage of the power MOSFET as inputs, and determine future drain-to-source resistance values of the power MOSFET using the machine learning model based on the extracted drain current and the drain-to-source voltage of the power MOSFET, wherein a fault condition of the power MOSFET is signaled in response to the predicted future drain-to-source resistance values exceeding a threshold.

In a first implementation form of the system according to the first aspect as such, the system further includes a test signal generator configured to receive a control signal initiating the extraction of the drain current and the drain-to-source voltage of the power MOSFET; and generate a conditioning signal to acquire the drain current and a drain-to-source voltage of the power MOSFET during a transient or switching phase of the power MOSFET in response to receiving the control signal.

In a second implementation form of the system according to the first aspect as such or any preceding implementation form of the first aspect, the system further includes an analog-to-digital converter configured to convert the drain current and the drain-to-source voltage of the power MOSFET from an analog signal to a digital signal before providing them to the machine learning model.

In a third implementation form of the system according to the first aspect as such or any preceding implementation form of the first aspect, the conditioning circuit is further configured to amplify the extracted drain current and the drain-to-source voltage of the power MOSFET to generate amplified signals; and convert the amplified signals to digital signals before providing them as inputs to the machine learning model.

In a fourth implementation form of the system according to the first aspect as such or any preceding implementation form of the first aspect, the power MOSFET is a power MOSFET of a traction inverter system in an electric car.

In a fifth implementation form of the system according to the first aspect as such or any preceding implementation form of the first aspect, signaling the fault condition comprises generating a check engine light by an electronic control unit (ECU) of a vehicle in response to the predicted future drain-to-source resistance values exceeding the threshold.

In a sixth implementation form of the system according to the first aspect as such or any preceding implementation form of the first aspect, the machine learning model is trained using a Levenberg-Marquardt algorithm.

A second aspect relates to a method to predict future drain-to-source resistance values of a power metal-oxide-semiconductor field-effect transistor (MOSFET). The method includes extracting a drain current and a drain-to-source voltage of the power MOSFET during a transient or switching phase of the power MOSFET; providing the drain current and the drain-to-source voltage of the power MOSFET as inputs to a machine learning model; determining future drain-to-source resistance values of the power MOSFET using the machine learning model based on the extracted drain current and the drain-to-source voltage of the power MOSFET; and signaling a fault condition of the power MOSFET in response to the predicted future drain-to-source resistance values exceeding a threshold.

In a first implementation form of the method according to the second aspect as such, the method further includes generating a conditioning signal to acquire the drain current and a drain-to-source voltage of the power MOSFET during a transient or switching phase of the power MOSFET in response to receiving a control signal initiating the extraction.

In a second implementation form of the method according to the second aspect as such or any preceding implementation form of the second aspect, providing the drain current and the drain-to-source voltage of the power MOSFET to the machine learning model comprises converting the drain current and the drain-to-source voltage of the power MOSFET from an analog signal to a digital signal.

In a third implementation form of the method according to the second aspect as such or any preceding implementation form of the second aspect, the method further includes feeding multiple values of the drain current and the drain-to-source voltage of the power MOSFET during the transient or switching phase of the power MOSFET as inputs to the machine learning model; and determining future drain-to-source resistance values of the power MOSFET using the machine learning model based on the multiple values of the extracted drain current and the drain-to-source voltage of the power MOSFET.

In a fourth implementation form of the method according to the second aspect as such or any preceding implementation form of the second aspect, the method further includes amplifying the extracted drain current and the drain-to-source voltage of the power MOSFET to generate amplified signals; and converting the amplified signals to digital signals before providing them as inputs to the machine learning model.

In a fifth implementation form of the method according to the second aspect as such or any preceding implementation form of the second aspect, the power MOSFET is a power MOSFET of a traction inverter system in an electric car.

In a sixth implementation form of the method according to the second aspect as such or any preceding implementation form of the second aspect, signaling the fault condition comprises generating a check engine light by an electronic control unit (ECU) of a vehicle in response to the predicted future drain-to-source resistance values exceeding the threshold.

A third aspect relates to a vehicle, comprising a conditioning signal sub-system configured to predict future drain-to-source resistance values of a power metal-oxide-semiconductor field-effect transistor (MOSFET), the conditioning signal sub-system comprising: a current sensing circuit configured to extract a drain current of the power MOSFET during a transient or switching phase of the power MOSFET, a conditioning circuit configured to extract a drain-to-source voltage of the power MOSFET during the transient or switching phase of the power MOSFET; and an electronic control unit (ECU) comprising a machine learning model, the ECU configured to: determine future drain-to-source resistance values of the power MOSFET using the machine learning model based on the extracted drain current and the drain-to-source voltage of the power MOSFET, and signal a fault condition of the power MOSFET in response to the predicted future drain-to-source resistance values exceeding a threshold.

In a first implementation form of the vehicle according to the third aspect as such, the conditioning signal sub-system comprises a test signal generator configured to receive a control signal initiating the extraction of the drain current and the drain-to-source voltage of the power MOSFET; and generate a conditioning signal to acquire the drain current and a drain-to-source voltage of the power MOSFET during a transient or switching phase of the power MOSFET in response to receiving the control signal.

In a second implementation form of the vehicle according to the third aspect as such or any preceding implementation form of the third aspect, the ECU comprises an analog-to-digital converter configured to convert the drain current and the drain-to-source voltage of the power MOSFET from an analog signal to a digital signal before providing them to the machine learning model.

In a second implementation form of the vehicle according to the third aspect as such or any preceding implementation form of the third aspect, the vehicle is an electric car, and wherein the power MOSFET is a power MOSFET of a traction inverter system of the vehicle.

In a second implementation form of the vehicle according to the third aspect as such or any preceding implementation form of the third aspect, the machine learning model is trained using a Levenberg-Marquardt algorithm.

In a second implementation form of the vehicle according to the third aspect as such or any preceding implementation form of the third aspect, the machine learning model is configured to receive multiple samples of the extracted drain current and the drain-to-source voltage of the power MOSFET before predicting the future drain-to-source resistance values of the power MOSFET.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A system to predict future drain-to-source resistance values of a power metal-oxide-semiconductor field-effect transistor (MOSFET), the system comprising:
   a current sensing circuit configured to extract a drain current of the power MOSFET during a transient or switching phase of the power MOSFET;
   a conditioning circuit configured to extract a drain-to-source voltage of the power MOSFET during the transient or switching phase of the power MOSFET; and
   a machine learning model configured to:
      receive the drain current and the drain-to-source voltage of the power MOSFET as inputs, and
      determine future drain-to-source resistance values of the power MOSFET using the machine learning model based on the extracted drain current and the drain-to-source voltage of the power MOSFET, wherein a fault condition of the power MOSFET is signaled in response to the predicted future drain-to-source resistance values exceeding a threshold.

2. The system of claim 1, further comprising a test signal generator configured to:
   receive a control signal initiating the extraction of the drain current and the drain-to-source voltage of the power MOSFET; and
   generate a conditioning signal to acquire the drain current and the drain-to-source voltage of the power MOSFET during a transient or switching phase of the power MOSFET in response to receiving the control signal.

3. The system of claim 1, further comprising an analog-to-digital converter configured to convert the drain current and the drain-to-source voltage of the power MOSFET from an analog signal to a digital signal before providing them to the machine learning model.

4. The system of claim 1, wherein the conditioning circuit is further configured to
   amplify the extracted drain current and the drain-to-source voltage of the power MOSFET to generate amplified signals; and
   convert the amplified signals to digital signals before providing them as inputs to the machine learning model.

5. The system of claim 1, wherein the power MOSFET is a power MOSFET of a traction inverter system in an electric car.

6. The system of claim 1, wherein signaling the fault condition comprises generating a check engine light by an electronic control unit (ECU) of a vehicle in response to the predicted future drain-to-source resistance values exceeding the threshold.

15

7. The system of claim 1, wherein the machine learning model is trained using a Levenberg-Marquardt algorithm.

8. A method to predict future drain-to-source resistance values of a power metal-oxide-semiconductor field-effect transistor (MOSFET), the method comprising:

extracting a drain current and a drain-to-source voltage of the power MOSFET during a transient or switching phase of the power MOSFET;

providing the drain current and the drain-to-source voltage of the power MOSFET as inputs to a machine learning model;

determining future drain-to-source resistance values of the power MOSFET using the machine learning model based on the extracted drain current and the drain-to-source voltage of the power MOSFET; and signaling a fault condition of the power MOSFET in response to the predicted future drain-to-source resistance values exceeding a threshold.

9. The method of claim 8, further comprising generating a conditioning signal to acquire the drain current and the drain-to-source voltage of the power MOSFET during a transient or switching phase of the power MOSFET in response to receiving a control signal initiating the extraction.

10. The method of claim 8, wherein providing the drain current and the drain-to-source voltage of the power MOSFET to the machine learning model comprises converting the drain current and the drain-to-source voltage of the power MOSFET from an analog signal to a digital signal.

11. The method of claim 8, further comprising:

feeding multiple values of the drain current and the drain-to-source voltage of the power MOSFET during the transient or switching phase of the power MOSFET as inputs to the machine learning model; and determining future drain-to-source resistance values of the power MOSFET using the machine learning model based on the multiple values of the extracted drain current and the drain-to-source voltage of the power MOSFET.

12. The method of claim 8, further comprising:

amplifying the extracted drain current and the drain-to-source voltage of the power MOSFET to generate amplified signals; and converting the amplified signals to digital signals before providing them as inputs to the machine learning model.

13. The method of claim 8, wherein the power MOSFET is a power MOSFET of a traction inverter system in an electric car.

14. The method of claim 8, wherein the signaling the fault condition comprises generating a check engine light by an electronic control unit (ECU) of a vehicle in response to the predicted future drain-to-source resistance values exceeding the threshold.

15. A vehicle, comprising:

a conditioning signal sub-system configured to predict future drain-to-source resistance values of a power metal-oxide-semiconductor field-effect transistor (MOSFET), the conditioning signal sub-system comprising:

a current sensing circuit configured to extract a drain current of the power MOSFET during a transient or switching phase of the power MOSFET, a conditioning circuit configured to extract a drain-to-source voltage of the power MOSFET during the transient or switching phase of the power MOSFET; and an electronic control unit (ECU) comprising a machine learning model, the ECU configured to:

determine future drain-to-source resistance values of the power MOSFET using the machine learning model based on the extracted drain current and the drain-to-source voltage of the power MOSFET, and signal a fault condition of the power MOSFET in response to the predicted future drain-to-source resistance values exceeding a threshold.

16. The vehicle of claim 15, wherein the conditioning signal sub-system comprises a test signal generator configured to:

receive a control signal initiating the extraction of the drain current and the drain-to-source voltage of the power MOSFET; and generate a conditioning signal to acquire the drain current and the drain-to-source voltage of the power MOSFET during a transient or switching phase of the power MOSFET in response to receiving the control signal.

17. The vehicle of claim 15, wherein the ECU comprises an analog-to-digital converter configured to convert the drain current and the drain-to-source voltage of the power MOSFET from an analog signal to a digital signal before providing them to the machine learning model.

18. The vehicle of claim 15, wherein the vehicle is an electric car, and wherein the power MOSFET is a power MOSFET of a traction inverter system of the vehicle.

19. The vehicle of claim 15, wherein the machine learning model is trained using a Levenberg-Marquardt algorithm.

20. The vehicle of claim 15, wherein the machine learning model is configured to receive multiple samples of the extracted drain current and the drain-to-source voltage of the power MOSFET before predicting the future drain-to-source resistance values of the power MOSFET.

* * * * *